(12) United States Patent
Smiley et al.

(10) Patent No.: US 8,120,432 B2
(45) Date of Patent: *Feb. 21, 2012

(54) SYSTEM AND METHOD FOR SELECTING OPTIMUM LOCAL OSCILLATOR DISCIPLINE SOURCE

(75) Inventors: Russell Smiley, Richmond (CA); Charles Nicholls, Nepean (CA)

(73) Assignee: Rockstar Bidco, LP, New York, NY (US)

( * ) Notice: Subject to any disclaimer, the term of this patent is extended or adjusted under 35 U.S.C. 154(b) by 155 days.

This patent is subject to a terminal disclaimer.

(21) Appl. No.: 12/487,933

(22) Filed: Jun. 19, 2009

(65) Prior Publication Data

US 2010/0321118 A1     Dec. 23, 2010

(51) Int. Cl.
*H03L 7/00* (2006.01)
(52) U.S. Cl. ............. 331/18; 331/34; 331/44; 331/46
(58) Field of Classification Search ............ 331/1 A, 331/2, 11, 18, 34, 44, 46; 375/357
See application file for complete search history.

(56) References Cited

U.S. PATENT DOCUMENTS

| | | | |
|---|---|---|---|
| 6,307,896 B1 | 10/2001 | Gumm et al. | |
| 6,711,230 B1 | 3/2004 | Nicholls et al. | |
| 6,901,106 B1 | 5/2005 | Chen et al. | |
| 7,015,762 B1 | 3/2006 | Nicholls et al. | |
| 7,126,429 B2* | 10/2006 | Mitric | 331/2 |
| 7,146,146 B2* | 12/2006 | Masenten et al. | 455/296 |
| 7,424,069 B1 | 9/2008 | Nicholls et al. | |
| 7,545,228 B1* | 6/2009 | Lu et al. | 331/175 |
| 7,764,131 B1* | 7/2010 | Seth et al. | 331/46 |
| 2001/0015678 A1 | 8/2001 | Wesolowski | |
| 2004/0180630 A1 | 9/2004 | Ichihara | |
| 2006/0071724 A1 | 4/2006 | Bartholomew | |
| 2010/0321122 A1* | 12/2010 | Smiley | 331/1 R |

OTHER PUBLICATIONS

Specification of U.S. Appl. No. 12/487,948, filed Jun. 19, 2009.
Specification of U.S. Appl. No. 12/497,980, filed Jul. 6, 2009.
TrueTime Model 560-5203-0, "Disciplined TCX0 Oscillator Manual", May 31, 2000, http://www.symmetricom.com/media/files/support/ttm/product-manual/man-560-5203-0.pdf, 27 pages.
International Search Report and Written Opinion for corresponding PCT Patent Application No. PCT/CA2010/000827, dated Sep. 16, 2010, 8 pages.
International Search Report and Written Opinion for corresponding PCT Patent Application No. PCT/CA2010/000828, dated Sep. 16, 2010, 8 pages.

(Continued)

*Primary Examiner* — Joseph Chang
*Assistant Examiner* — Jeffrey Shin

(57) ABSTRACT

A device is provided having a local oscillator (LO) configured to generate a first signal having timing information, frequency information, phase information or combinations thereof. The device also includes a prioritizer comprising at least two inputs, each input configured to receive a respective second signal having timing information, frequency information, phase information or combinations thereof. The prioritizer is configured to determine an accuracy of at least one second signal of the at least two second signals in relation to a second signal assigned to be a most accurate of the at least two second signals. The prioritizer is also configured to order the at least two second signals from most accurate to least accurate. The LO is disciplined to correct an offset error of the LO relative to a most accurate second signal that is available to the device, based on the order of the at least two second signals.

20 Claims, 6 Drawing Sheets

OTHER PUBLICATIONS

Penrod B.M., "Adaptive temperature compensation of GPS disciplined quartz and rubidium oscillators", Frequency Control Symposium, Proceedings of the 1996 IEEE International, Jun. 5, 1996, pp. 980-987.

European Search Report for corresponding European Patent Application No. 10168545.1, date of completion of search: Sep. 24, 2010, 2 pages.

Notice of References Cited from related U.S. Appl. No. 12/487,948, Feb. 2, 2011, 1 page.

* cited by examiner

SYSTEM AND METHOD FOR SELECTING OPTIMUM LOCAL OSCILLATOR DISCIPLINE SOURCE

FIELD OF THE INVENTION

The invention relates to disciplining the timing and/or frequency value of a local oscillator.

BACKGROUND OF THE INVENTION

In some networks, a network node of the network may have a local oscillator (LO) that is used for timing purposes at the network node. To reduce the cost of the network node, the LO may not be as accurate as a master timing reference source that provides a timing signal to the network.

The LO of the network node can be disciplined by an external timing reference source to correct offset errors that occur over time.

When a single master timing reference source is used to discipline the LO, if for some reason the master reference source is not accurate or if the master reference is unable to be used to discipline the local oscillator, for example in the case where a GPS signal is used as the timing reference source and the GPS lock is lost, or if a network malfunction means that a network master timing reference is unavailable, then performance of the network node and any other nodes that may rely on the network node's local timing signal may be impaired. Once the master reference is unavailable and since there are no alternative references available, then human intervention may be required to correct or reset the timing of the network node. However, human intervention can be time consuming and costly to implement.

SUMMARY OF THE INVENTION

According to an aspect of the present invention, there is provided a device comprising: a local oscillator (LO) configured to generate a first signal comprising at least one of: timing information; frequency information; phase information; and combinations thereof; a prioritizer comprising at least two inputs, each input configured to receive a respective second signal comprising at least one of: timing information; frequency information; phase information; and combinations thereof, the prioritizer configured to: determine an accuracy of at least one second signal of the at least two second signals in relation to a second signal assigned to be a most accurate of the at least two second signals; and order the at least two second signals from most accurate to least accurate; wherein the LO is disciplined to correct an offset error of the LO relative to a most accurate second signal that is available to the device, based on the order of the at least two second signals.

In some embodiments, a second signal of the at least two second signals is selected to be the assigned most accurate second signal for the purpose of ordering the at least two second signals.

In some embodiments, if the assigned most accurate second signal is unavailable, the LO is disciplined relative to a next most accurate second signal that is available to the device, based on the ordering of the at least two second signals.

In some embodiments, each input of the at least two inputs is configured to receive a respective second signal that is one of a group of signals including: a) a GPS timing signal; b) a network timing signal; c) a network frequency signal; d) a signal resulting from a mathematical model of the LO; and e) a signal derived from a period during which the LO was disciplined by the assigned most accurate second signal; and f) a signal comprising synchronization information.

In some embodiments, the network timing signal is in accordance with IEEE 1588.

In some embodiments, the network frequency signal is in accordance with at least one of: Synchronous Ethernet and adaptive clock recovery (ACR).

In some embodiments, the mathematical model of the LO is at least one of: generated by the device; and maintained by the device.

In some embodiments, each input of the at least two inputs is configured to receive a respective second signal via one of: free space; an electrical conduit; and an optical conduit.

In some embodiments, the order of the at least two second signals from most accurate to least accurate changes over time depending on various factors that affect the second signals.

In some embodiments, the device is configured to perform at least one of: a) receive information sent by at least one source external to the device, the information pertaining to availability of the at least one source to provide to one input of the at least two inputs a respective second signal; and b) detect availability of at least one source external to the device that provides to one input of the at least two inputs a respective second signal.

In some embodiments, the prioritizer further comprises: a plurality of correction signal generators, each correction signal generator associated with a respective input, each correction signal generator configured to receive a second signal; each correction signal generator configured to receive a clock signal from the LO; each correction signal generator configured to generate a correction signal that is a function of the received input and the clock signal from the LO; a plurality of summers, one summer for each second signal except the second signal assigned to be the most accurate, each summer configured to receive a correction signal from the second signal assigned to be the most accurate and a correction signal from one of the other second signals; a correction signal selector configured to receive outputs of the plurality of summers, wherein the correction signal selector is further configured to order the at least two second signals from most accurate to least accurate as a function of the outputs of the summers.

According to another aspect of the invention, there is provided a method comprising: a local oscillator (LO) generating a first signal comprising at least one of: timing; frequency; phase information; and combinations thereof; receiving at least two second signals, each second signal comprising at least one of: timing information; frequency information; phase information; and combinations thereof, wherein at least one of the at least two second signals is received from an external source; determining an accuracy of at least one second signal of the at least two second signals in relation to a second signal assigned to be the most accurate of the at least two second signals; ordering the at least two second signals from most accurate to least accurate; and disciplining the LO to correct an offset error of the LO relative to a most accurate second signal that is available, based on the ordering of the at least two second signals.

In some embodiments, the method further comprises: selecting a second signal of the at least two second signals as the assigned most accurate second signal for the purpose of ordering the at least two second signals.

In some embodiments, when the assigned most accurate second signal is unavailable the method comprises: disciplining the LO to correct the offset error comprises disciplining the LO to correct the offset error relative to a next most accurate second signal that is available, based on the ordering of the at least two second signals.

In some embodiments, receiving each of the at least two second signals comprises for each of the at least two second signals, receiving a respective signal that is one of a group of signals comprising: a) a GPS timing signal; b) a network timing signal; c) a network frequency signal d) a signal resulting from a mathematical model of the LO; and e) a signal derived from a period during which the LO was disciplined by the assigned most accurate second signal; and f) a signal comprising synchronization information.

In some embodiments, receiving the network timing signal comprises receiving the network timing signal in accordance with IEEE 1588.

In some embodiments, receiving the network frequency signal comprises receiving the network frequency signal in accordance with at least one of: Synchronous Ethernet and adaptive clock recovery (ACR).

In some embodiments, the method further comprises at least one of: generating the mathematical model of the LO; and maintaining the mathematical model of the LO.

In some embodiments, the method further comprises at least one of: a) receiving information sent by at least one external source, the information pertaining to availability of the at least one external source to provide a second signal of the at least two second signals; and b) detecting availability of at least one external source that provides a second signal of the at least two second signals.

In some embodiments, the method further comprises reordering the at least two second signals from most accurate to least accurate based on various factors that affect the second signals over time.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described with reference to the attached drawings in which.

DETAILED DESCRIPTION OF THE EMBODIMENTS OF THE INVENTION

Figure 1:
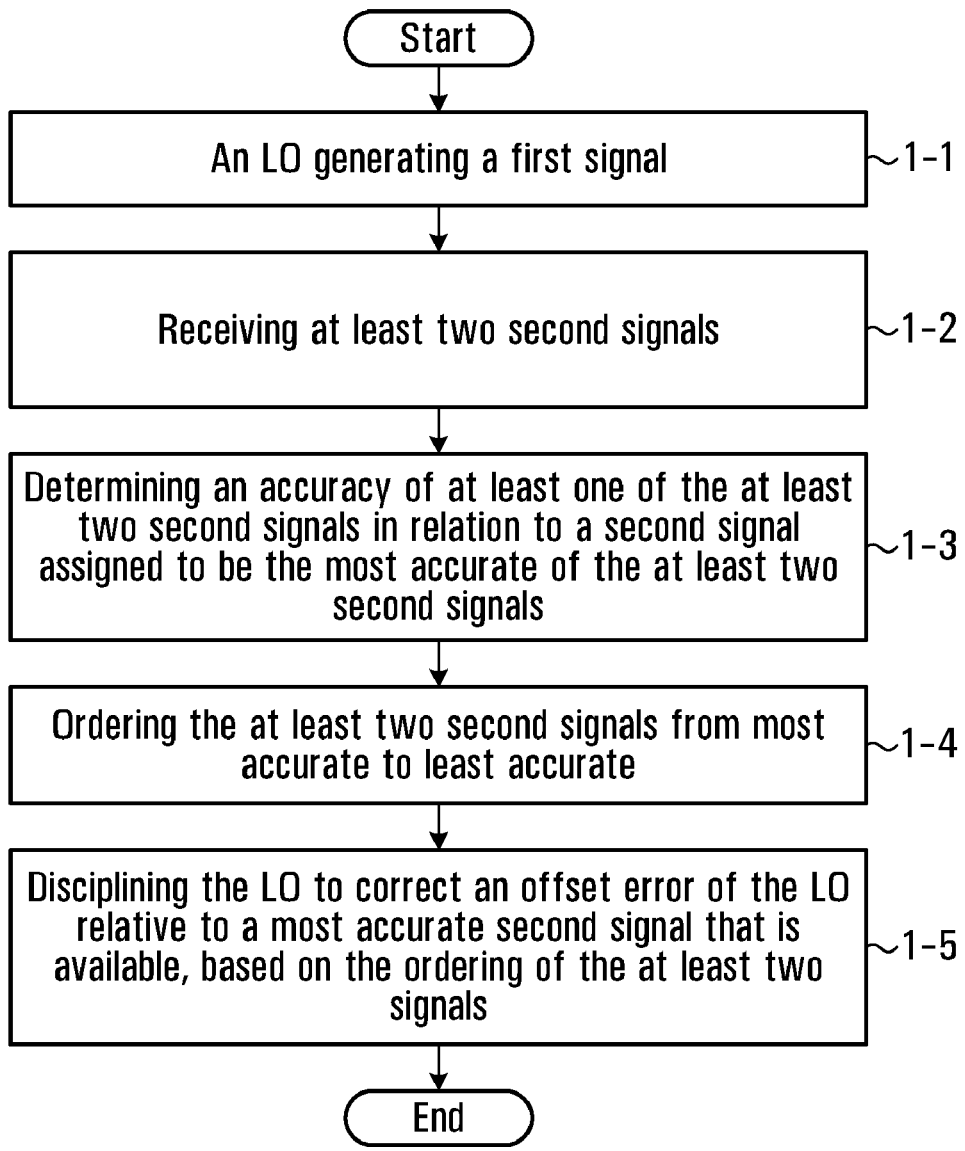
FIG. 1 is a flow chart illustrating an example of a method according to an aspect of the invention.

In current implementations in which networks have multiple network elements, for example multiple base stations or network relays, which include local clock sources, there is no communication between the local clock sources. As a result, multiple redundancy of the local clock sources is not leveraged to improve the synchronization robustness of the overall network of clocks.

The present invention describes a system and method whereby a local oscillator (LO) is used to maintain time locally at a slave device, the LO being disciplined to keep accurate time relative to one of multiple master time and/or frequency reference sources. In some embodiments, one or more of the multiple master time and/or frequency reference sources are more accurate and/or more stable than the LO. Therefore, when the primary reference is unavailable then an alternative reference may be used to discipline the LO so as to provide a more accurate time and/or frequency signal than the LO could itself otherwise provide.

In some embodiments, one or more of the multiple master time and/or frequency references are less accurate and/or less stable than the LO being disciplined, provided that: (1) the accuracy (which represents a frequency offset) can be accurately characterized by the LO whilst disciplined by a more stable and accurate reference; and (2) the time dependent frequency stability of the master time and/or frequency reference source can be characterized whilst the LO is being disciplined by a more stable reference. Use of reference characterization in the form of (1) and (2) can enable accuracy and stability to be compensated for in the reference source making it viable for use in the event that the primary reference is lost.

When more than one time and/or frequency reference is available, one of the time and/or frequency references is selected as a primary reference. The primary reference is selected as the most accurate of the available references. The primary reference is any time and/or frequency source that is considered to be a definitive time and/or frequency reference for the purposes of time synchronization and/or frequency syntonization of the system. The other time and/or frequency references are less accurate references that may be used when the primary reference is unavailable. The master reference source that is selected as the primary reference may change from time to time. For example, if a new master reference source that was previously unavailable when the primary reference was selected is determined to be more accurate than the current primary reference, the new master reference may be selected as the primary reference and the former primary reference is allocated to be an alternative reference.

One or more of the time and/or frequency references may also have a phase component of the reference signal that can be utilized in disciplining the LO.

Time and/or frequency references include, but are not limited to, a signal from a GPS source, a mathematical model of the LO, a signal from a network time reference source, and/or a signal from a network frequency reference source. In some embodiments the time and/or frequency signal is received at the network node from an external source, such as in the case with the signal from the GPS source, the signal from the network time reference source, and the signal from the network frequency reference source. In some embodiments, the time and/or frequency signal may be generated or maintained on the network node, such as in the case of the model of the LO. However, these examples are not intended to limit the invention. For example, it may be possible that an LO model could be generated and/or maintained at a different network node and a resulting time and/or frequency reference signal based on the model is then transmitted to the network node with the LO. The time and/or frequency references may communicate time information, frequency information, phase information or combinations thereof to another device via free space (for example via radio waves), over an electrical conduit, over an optical conduit, or over some combination thereof between two network nodes that have one or more links.

A further example of a reference source is a compensated reference source in which frequency and/or phase accuracy and stability in a network source have been characterized relative to an available known accurate reference, such as a GPS signal. Compensation of one or more of such characterized sources then makes them viable alternates to the primary reference source.

An example of compensating a reference source is the use of a synchronous Ethernet clock signal in which there is no phase information, but the frequency is extremely stable and accurate. Comparison of such a source with a GPS reference enables phase information to be determined with respect to the GPS reference, and as a result the synchronous Ethernet clock signal can be calibrated for use in synchronization applications.

An example of a signal from a network time reference source is a timing signal from an IEEE1588 enabled network node. An example of a signal from a network frequency reference source is a frequency signal from a Synchronous Ethernet and/or ECS (Ethernet Clock Synchronization) enabled network node. Alternatively, a signal from a network frequency reference source is a signal from an adaptive clock recovery (ACR) enabled network node.

In some embodiments, an LO can be disciplined based on time and/or frequency information derived from a period during which the LO was disciplined by the primary reference source. An example will be described below.

In some embodiments of the invention, disciplining the LO involves comparing the time and/or frequency reference selected as the primary reference with an output of the LO to produce a "correction factor". The correction factor may then be used to correct an offset error in the LO by bringing the LO into alignment with the primary reference. A comparison of the primary reference to the LO may be performed on a cycle by cycle basis. In some embodiments a cycle is approximately one second. However, it is to be understood that embodiments of the invention may apply to a system in which the cycle time is less than 1 second or greater than 1 second. Furthermore, in some implementations, the cycle time may be irregular and vary from tens of seconds to several minutes.

The LO can continue to be disciplined by the primary reference until the primary reference becomes unavailable. When the primary reference becomes unavailable the discipline of the LO can continue by selecting an alternative reference selected as the next most accurate time and/or frequency reference. If this alternative reference becomes unavailable then the LO may be disciplined with the next most accurate and stable time and/or frequency reference, and so on, until the least accurate reference is being used.

With regard to the above description it is noted that accuracy refers to a static offset of frequency or phase from a target value and stability refers to a time dependent variation of a value about the target value.

In some embodiments, when the primary reference is being used to discipline the LO, a correction factor for each of the alternative references is determined. In some embodiments, when the primary reference is being used to discipline the LO, a correction factor for each alternate reference of a selected subset of all of the alternative references is determined. In some embodiments, the correction factor for a given alternative resource is a function of the output of the LO, the given alternative resource and the primary reference.

In some embodiments, when the primary reference is available the correction factors determined for each of the alternative references is compared with the correction factor determined based on the primary reference. This comparison of correction factors can be used to determine an ordering of the alternative references from most accurate/stable to least accurate/stable with regard to the correction factor determined based on the primary reference.

In some embodiments, determining an ordering of the alternative references is performed only during a period when the primary reference is available as the most accurate reference. In such an embodiment, when the primary reference becomes unavailable, the most accurate alternative reference is selected and the ordering of the remaining alternative references remains based upon the period when the primary reference was still available.

In some embodiments, determining correction factors and ordering of the alternative references is performed on a continual basis regardless of which reference is being used to discipline the LO. In such an embodiment, when the primary reference becomes unavailable, the most accurate alternative reference based on the ordering that is available is selected to discipline the LO. A correction factor for the selected most accurate alternative reference is determined by comparison with the output of the LO.

In some embodiments, when the primary reference is unavailable, the correction factors determined for each of the alternative references is compared with the currently selected most accurate alternate reference correction factor. This comparison can be used to determine an ordering of the alternative references from most accurate to least accurate with regard to the currently selected most accurate alternate reference being used to discipline the LO.

Once the ordering of the references has been determined and the most accurate reference that is available has been selected, either the primary reference or an alternative reference when the primary reference is unavailable, the LO is disciplined based on the correction signal derived from the selected most accurate reference available.

In some embodiments, the ordering of alternative references could change over time depending on various factors that affect the time and/or frequency signal provided by the master reference sources. The factors may include, but are not limited to, environmental factors, such as weather and/or topology, mobility factors, signal interference and/or reliability factors.

In some embodiments a frequency reference is evaluated for use as a time reference. If the frequency of the frequency reference is sufficiently stable, then it may be used to meet a timing requirement.

An example of a method pertaining to some embodiments of the invention will now be discussed with reference to the flow chart of FIG. 1. A first step 1-1 of the method involves a LO generating a first signal including time information, frequency information, phase information or combinations thereof.

A second step 1-2 involves receiving at least one second signal including time information, frequency information, phase information or combinations thereof. In some embodiments at least one second signal is more accurate than the first signal. In some embodiments, receiving at least one timing signal may include receiving any one or more of a GPS timing signal, a network timing signal or a network frequency signal.

A third step 1-3 involves determining an accuracy of at least one of the at least two second signals in relation to a second signal assigned to be a most accurate of at least two second signals. In some embodiments, determining the accuracy of at least one second timing signal includes determining the accuracy of time and/or frequency signals that were received from external to the device containing the LO as well as time and/or frequency signals that may originate on the device. An example of a signal that may originate on the device is a time and/or frequency signal based on a model of the LO that is generated or maintained on the device or a time and/or frequency signal that is generated or maintained based on a duration of time during which the LO was disciplined by the primary reference.

A fourth step 1-4 involves ordering the at least two second signals from most accurate to least accurate. The most accurate time and/or frequency signal is designated as the primary reference and the other time and/or frequency signals are ordered in a manner that the next most accurate signal would be selected for disciplining the LO if the primary reference becomes unavailable.

In some embodiments, the primary reference is designated prior to ordering of the time and/or frequency signals and as such the alternative time and/or frequency signals are ordered from most accurate to least accurate, wherein the most accurate is the most accurate after the primary reference. In some embodiments, the primary reference is designated based on known performance of the source. For example, GPS is known to have a specified accuracy that is a function of the system. Consequently, if GPS is available the uncertainty with respect to the source stability is not in question and the source may be designated as primary, if there is no other source available that has a better source stability.

The ordering of the secondary references relative to the primary reference depends on the selection of the primary reference. In some implementations, a 'secondary primary reference' may be identified such that if the primary reference is unavailable, the secondary primary reference is used as the primary reference. Performance of the source being considered as a possible secondary primary reference would have to be predetermined to ensure that the source is appropriate for the system to use as a primary reference if the original primary reference was lost.

A fifth step 1-5 involves disciplining the LO to correct an offset error of the LO relative to a most accurate second signal that is available, based on the ordering of the at least two second time and/or frequency signals.

In some embodiments, the method further involves the device in which the LO operates receiving information sent by at least one of the master reference sources pertaining to availability of the at least one master reference source to provide the second signal. In some embodiments, the method may involve the device detecting availability of at least one source that provides a time and/or frequency signal. If the device is able to determine the availability of the sources, this may aid in selecting an appropriate second signal, especially if it can be determined if and when a primary signal may be unavailable.

A system configured to implement a method according to the present invention will now be described with reference to FIG. 2. The system 100 includes a slave device 150 and multiple master reference sources.

A master reference source may be a timing reference source or a frequency reference source, either of which may include a phase component in the source signal. In FIG. 2, a first master reference source is network clock 110 which receives a time and/or frequency signal from satellite 120 and then forwards the time and/or frequency signal to slave device 150 via network node 160. A second master reference source is a satellite 120 that provide GPS timing information directly to the slave device 150. In some embodiments, more than one satellite may be available to provide timing and/or frequency signals. A third master reference source is network clock 140 that transmits a time and/or frequency signal to the slave device 150 via network nodes 142,144,146. A fourth master reference source is network clock 130 that transmits a reference signal to slave device 150 via base station (BTS) 135. A fifth master reference source is network clock 175 that transmits a reference signal to slave device 150 via BTS 180, using wireless mobile device 170 as a relay.

Of the various master clocks from which the slave device may receive a time and/or frequency signal, some may be ultimately derived from the same source, but depending on availability at any given time, not all might be available at the same time. For instance satellite 120 supplies time and/or frequency information directly to slave device 150 and via a network node that contains network clock 110. At a given time due to inclement weather in close proximity to slave device 150, the slave device may not be able to receive the timing information from satellite 120. However, the ability of the node containing network clock 110 to receive information from satellite 120 is not interrupted by the inclement weather. Network clock 110 is able to receive the timing information from satellite 120 and forward the time and/or frequency signal to slave device 150.

In some embodiments, the various master clock sources may originate from unrelated i.e. unsynchronized network clocks.

Figure 2:
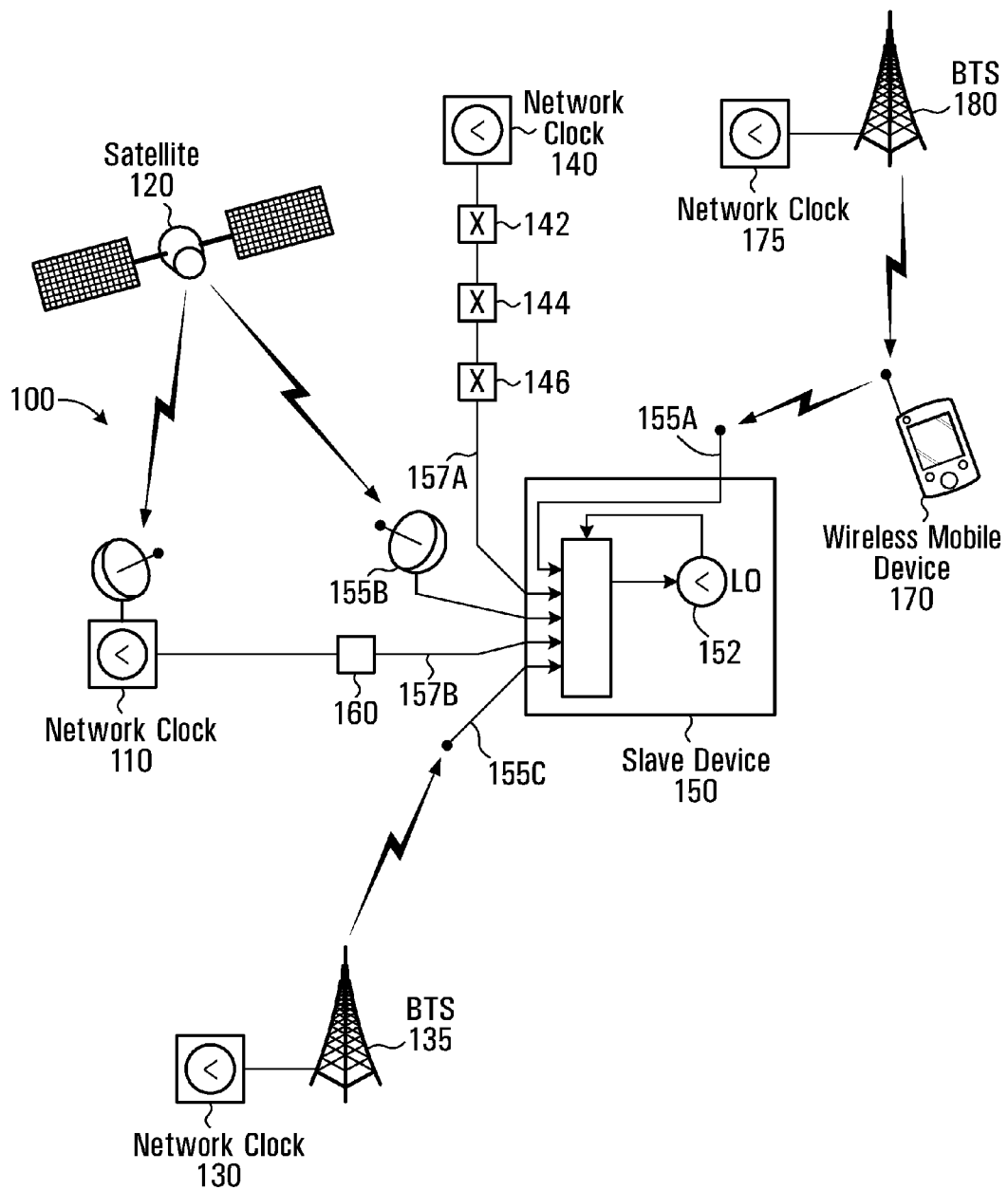
FIG. 2 is a schematic diagram of a system in which some embodiments of the present invention may be implemented.

While a wireless mobile device is shown as a relay device in FIG. 2, it is to be understood that devices other than wireless mobile devices can act as relay devices. In an alternative implementation, a relay is a simplified BTS designed to transfer wireless signals in regions where there are inadequate BTS, such as in rural areas or where there are urban canyons which can cause severe fading problems. For example, a first slave device having a first LO may receive time and/or frequency information to discipline the first LO from a second slave device having a second LO, in which the second LO is being disciplined by a master reference source.

The slave device 150 is configured to receive time and/or frequency signals from one or more master reference sources 110,120,130,140,175. As discussed above, in some implementations the slave device 150 has a LO 152 that has less accuracy relative to the other master reference sources and in other implementations the LO 152 has greater accuracy relative to one or more other master reference sources, if the conditions discussed above are met with regard to reference characterization of the accuracy and time dependent frequency stability.

The slave device 150 of FIG. 2 has three antennas 155A, 155B, 155C to receive wireless signals from one or more of the master reference sources. Antennas 155A and 155C receive wireless signals from wireless mobile device 170 and BTS 135, respectively, and antenna 155B receives wireless signals from satellite 120. The number of antennas that a slave device includes is implementation specific. An antenna may be used to receive signals from more than one master reference source.

In some embodiments, the slave device 150 is connected to one or more of the master reference sources via a wired network connection. The slave device 150 of FIG. 2 is connected to network clock 140 via network nodes 142,144,146 by a wired connection. The last link between network node 146 and slave device 150 is indicated by wired link 157A. The slave device 150 of FIG. 2 is also connected to network clock 110 via network nodes 160 by a wired connection. The last link between network node 160 and slave device 150 is indicated by wired link 157B. The number of wired connections to network clocks is implementation specific. Furthermore, the number of hops between a network clock and the slave device via network nodes is implementation specific.

In some embodiments the connection between the network clock and the slave device could be some combination of wired and wireless links.

FIG. 2 illustrates only a single slave device 150 in the system 100, but it is to be understood that a network may have more than a single slave device of the type described herein. Factors that may affect the number of slave devices in a network include, but are not limited to, the size of the network, the geographical terrain the network covers and the power requirements of the slave device and/or master resource sources.

In some embodiments, the slave device receives a time and/or frequency signal from a network clock that is in close proximity to the slave device. In some embodiments, the slave device may receive a time and/or frequency signal from a network clock that is not in close proximity to the slave device and the time and/or frequency signal must be forwarded over one or more network nodes.

FIG. 2 illustrates an example network node 160, via which network clock 110 sends a time and/or frequency signal to slave device 150. Depending on the distance between the network clock 110 and the slave device 150, this may result in network delays of the time and/or frequency signal reaching the slave device 150. To varying degrees network delay may be compensated for, but such delay may result in the time and/or frequency signal from a given master reference source being less accurate than other master reference source signals, or the time and/or frequency signal from the given master reference source being unreliable, or potentially unavailable.

In some embodiments, the slave device may receive a time and/or frequency signal from a GPS source that is not directly received from a satellite, but from a network node that is configured to obtain the time and/or frequency signal from the satellite and forward it over a network, either wired or wireless, to the slave device. FIG. 2 illustrates an example of network clock 110 receiving time and/or frequency information from satellite 120 and sending a time and/or frequency signal to slave device 150. The network node may or may not be in close proximity to the slave device. In a situation where the network node is not in close proximity to the slave device, a delay in receiving the time and/or frequency signal may occur.

In some embodiments, the slave device may receive time and/or frequency signal from a master resource source that is transmitting to the slave device on an "over-the-air" (OTA) interface. FIG. 2 illustrates an example of an OTA connection between slave device 150 and BTS 135. The master reference source, network clock 130 may be in communication with BTS 135 over a wired or wireless connection.

In some embodiments, the slave device may receive a time and/or frequency signal by use of a relay. As illustrated in FIG. 2, BTS 180 provides a time and/or frequency signal from network clock 175 via wireless mobile device 170. BTS 180 may or may not be in close proximity to the slave device 150. In a situation where BTS 180 and/or wireless mobile device 170 is/are not in close proximity to the slave device 150, a delay in receiving the time and/or frequency signal may occur that will need to be compensated for on arrival at the slave device 150.

Types of master reference sources are not intended to be limited to only those described with reference to FIG. 2. These are merely used as exemplary types of time and frequency reference sources. Other types of master reference sources that provide time and frequency signals to the slave device may include network distribution of: atomic clock signals using rubidium or caesium standards; Long Range Aid to Navigation (LORAN) timing signals; and synchronization signals present in television broadcast signals.

FIG. 2 is illustrative of different types of reference sources and difference types of connections between the references sources and the slave device. Implementations of embodiments of the invention are implementation specific and may include types of reference sources and connections described specifically in FIG. 2 or other types of reference sources and connections described herein.

In some embodiments, the network clock can transmit a time and/or frequency signal to the slave device in a physical layer, for example a layer 1 implementation. In some embodiments, the physical layer implementation is performed in accordance with the Synchronous Ethernet (SyncE) standard. In some embodiments in which a layer 1 implementation occurs network nodes between the master reference source and the slave device may utilize the master reference source time and/or frequency signal to clock the signal across the network node. In FIG. 2 for example, network nodes 142,144, 146 may use the network clock signal from network clock 140 to clock data across the respective network nodes in the physical layer.

In some embodiments, the network clock can transmit a time and/or frequency signal to the slave device in a software layer, for example, a layer 2 implementation. In a particular example of a software layer implementation, data packets transmitted by the master reference source to the slave device are encoded with time and date information that enable the slave device to determine network delay and determine the time and/or frequency signal used to discipline the slave device. In some embodiments, the software layer implementation is performed in accordance with the IEEE 1588 standard for frequency/time transfer protocol. With reference again to FIG. 2, network clock 130 is transmitting a time and/or frequency signal to BTS 135 using a layer 2 implementation and BTS 135 transmits this signal to the slave device 150 using the layer 2 implementation.

While multiple types of transmission schemes i.e. layer 1 and layer 2, between a master reference source and the slave device are described above, this is not to be considered a complete list of schemes by which the slave device can receive a time and/or frequency signal from master reference sources. Other types of transmission schemes are contemplated.

In some embodiments, the slave device may be a part of a BTS in a wireless communication network. In some embodiments, the slave device may be part of a network node, such as a relay in wireless communication network. In some embodiments, the slave device may be part of an enterprise network. In some embodiments, the slave device may be a wireless terminal in the wireless communication network, for example, but not limited to, a cell phone or wirelessly enabled computer or Personal data Assistant (PDA). Generally speaking, the slave device may be part of, or located in closed proximity to, any type of network element in a network in which the network element can utilize a localized timing source such as a LO. In some embodiments, the use of an LO, which can be disciplined in the manner described herein may enable the use of a less expensive type of LO in the network element, which correspondingly reduces the financial cost of the network element.

Figure 3:
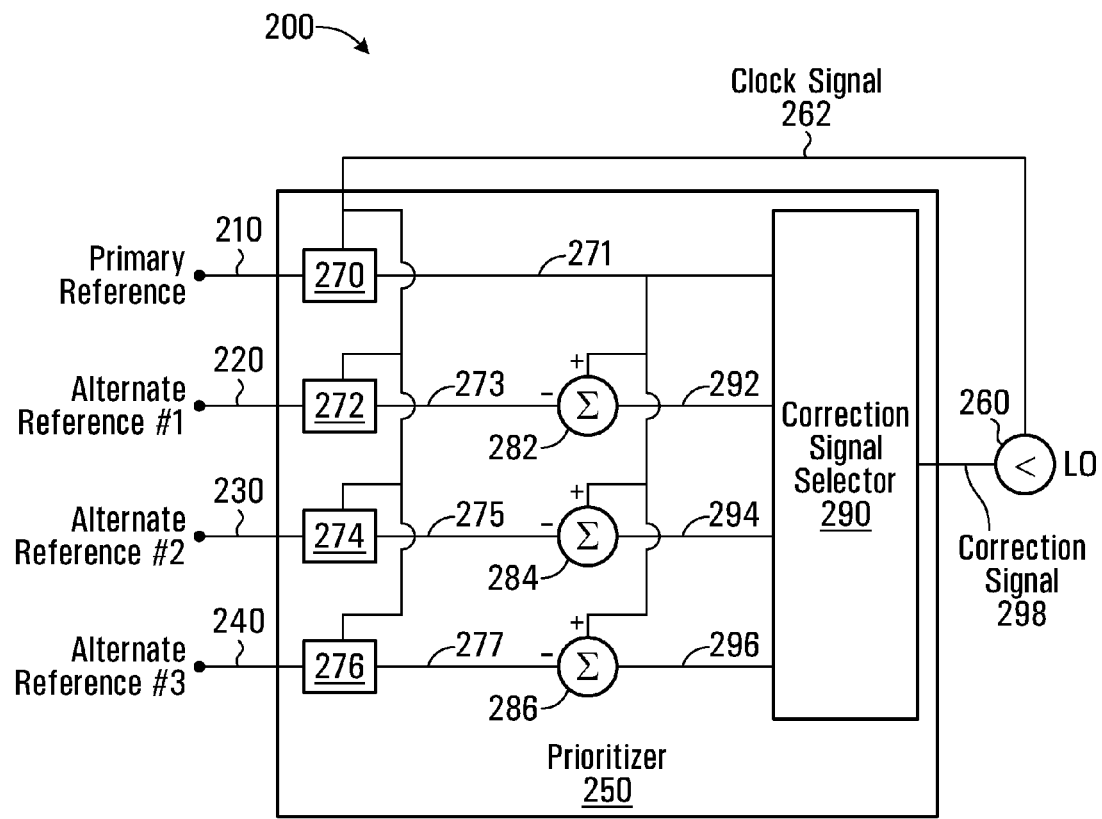
FIG. 3 is a schematic diagram of an example of a slave device according to an aspect of the invention.

A more detailed example of a slave device, such as that described in FIG. 2 will now be described with reference to FIG. 3. FIG. 3 illustrates a slave device 200 having multiple inputs 210,220,230,240 for receiving time and/or frequency signals from multiple master reference sources (not shown). The slave device also includes a prioritizer 250 that determines a correction signal for one or more of the supplied time and/or frequency signals received at the inputs 210,220,230, 240, prioritizes the correction signals from most accurate to least accurate and provides the most accurate reference to the LO in order to discipline the LO and reduce offset error in the LO that may have occurred since the last time that the LO was disciplined. The operation of the prioritizer 250 will be described in further detail below. An output 298 of the prioritizer 250 is provided to an LO 260. An output 262 of LO 260 is also provided to an input of the prioritizer 250 to aid in determining a correction signal from one or more of the inputs.

A first input 210 to the prioritizer 250 is for a primary reference signal. The primary reference is selected based on at least one criterion that indicates that it provides the most accurate time and/or frequency signal. The remainder of the inputs are for alternative master reference source time and/or frequency signals, namely input 220 for Alternative Reference #1, input 230 for Alternative Reference #2 and input 240 for Alternative Reference #3. The output 262 from the LO is fed back to the prioritizer 250. While four inputs are illustrated in FIG. 3, this is merely an exemplary embodiment. The number of inputs for receiving signals from master reference sources is implementation specific.

In some embodiments, the primary reference and the alternative references may be selected from a set of time and/or frequency signals from master reference sources including at least a GPS signal and at least one network clock signal. In some embodiments, a time and/or frequency signal may be generated based on a model of the LO. In some embodiments, the signal generated from the model of the LO may be selected for use as either the primary reference or an alternative reference. In some embodiments, a time and/or frequency signal is derived from a period during which the LO was disciplined by the primary reference source. A particular example, which is not intended to limit the invention, is when it is determined during a period that the primary reference is available and used to discipline the LO, that there is a substantially linear relationship between the amount of deviation between the LO and the primary reference over time, then when the primary reference is unavailable, the LO can be disciplined based on the determined linear relationship and the amount of time since the LO was last disciplined.

A master reference source signal may be determined to be the primary reference internally in the slave device. In some embodiments the slave device may be configured to make such a determination subsequent to receiving the reference source signals and prior to the inputs shown in FIG. 3. In some embodiments, determining which master reference source is the primary reference is based on some comparison of the multiple signals received to determine which master reference source provides the most accurate time and/or frequency signal. In some embodiments, determining which master reference source is the primary reference is based on a default selection of the signal from a particular master reference source. In some embodiments, determining which master reference source is the primary reference is based on selection from a list of ordered master reference sources. An example of selecting a particular master reference source as the primary reference is selecting the master reference source provided from a GPS satellite as the primary reference. An example of selecting the primary source from a list of ordered master reference sources involves selecting the primary reference from an ordered list including 1) GPS master resource source 2) network clock resource source and 3) LO model. The first choice for primary reference based on the ordering would be the GPS source. However, if the GPS were not available, the network clock source may be selected as the primary reference, and so on.

Referring again to FIG. 3, in slave device 200, the primary reference received on input 210 is provided to a first correction signal generator 270. The output 262 of the clock signal is also provided to the first correction signal generator 270. An output from the first correction signal generator 270 is a correction signal 271 that can be used in disciplining the LO 260 relative to the primary reference. Alternative Reference #1 received on input 220 is provided to a second correction signal generator 272. The output 262 of the clock signal is also provided to the second correction signal generator 272. Similar connectivity is illustrated for Alternative Reference #2 received on input 230 and Alternative Reference #3 received on input 240 via third and fourth correction signal generators 274 and 276, respectively.

A correction signal 273 from the second correction signal generator 272 is provided to a first summer 282. The correction signal 271 from the first correction signal generator 270 is also provided to the first summer 282. An output 292 of the first summer 282 is a difference between the primary reference correction signal 271 and the Alternative Reference #1 correction signal 273. A correction signal 275 from the third correction signal generator 274 is provided to a second summer 284. The correction signal 271 from the first correction signal generator 270 is also provided to the second summer 284. An output 294 of the second summer 284 is a difference between the primary reference correction signal 271 and the Alternative Reference #2 correction signal 275. Alternative Reference #3 correction signal 277 is processed in a similar manner to Alternative References #1 and #2 using summer 286.

Outputs of summers 282,284,286 along with the primary reference correction signal 271 are provided to correction signal selector 290. Correction signal selector 290 then orders the various correction signals in terms of most accurate to least accurate relative to the primary reference.

The correction signal selector 290 then selects the correction signal that is available with the most accurate correction signal. When the primary reference is available, then the correction signal based on the primary reference is used. If the primary reference is not available, then the next most accurate correction signal, based upon the ordering performed by the corrector signal selector that is available is selected.

In some embodiments, if the primary reference is not available, then the next most accurate alternate reference may be applied at input 210, such that correction signal 271 is a result of a comparison between the next most accurate alternate reference and an output of the LO. The correction signal 271 can then be compared to the other alternative correction signals as discussed above and the correction signals can be ordered appropriately in relation to the next most accurate alternate reference.

In an alternative embodiment instead of the next most accurate alternate reference being input to input 210, the alternative reference signals are maintained at the inputs illustrated in FIG. 3, and the outputs of the signal correlators 272,274,276 are provided directly to the correction signal selector 290, as well as to the summers 282,284,286, respectively, such that the correction signal selector 290 can select an appropriate correction signal 298 from the outputs of the signal correlators 272,274,276, based on the selection made by the ordering of the outputs of the summers 282,284,286 as described above.

FIG. 3 is an example of how a prioritizer may be implemented, but other physical implementations that provide a result of ordering multiple alternative references and selecting a next most accurate alternative reference when the primary reference is unavailable are considered within the scope of the invention.

The prioritizer 250 may be implemented in software, hardware, or some combination thereof. For example, in a software implementation the various signal comparison processes are implemented as one or more software modules and the ordering functionality is implemented as another module. In a hardware implementation, the various signal comparison processing and ordering functionality may be implemented using, for example, but not limited to, an ASIC or a FPGA.

Improving Holdover Time

In another aspect of the invention, when a primary master reference source becomes unavailable, a holdover state is entered in which an attempt is made to maintain the timing synchronization and/or frequency syntonization of the LO based on a model of the LO's behaviour over environmental parameters such as temperature, time, supply voltage, etc. A problem with the holdover state is that allowable holdover duration is limited by the accuracy of the holdover model being used and the stability of the LO. In some embodiments, the holdover state may occur when other external master reference sources are available to discipline the LO or when an internal reference source that is a model of the LO is used to discipline the source.

In general, every time the primary master reference source is reacquired, after being unavailable, then more information about the time/frequency accuracy and/or stability of the LO is obtained. However, in the context of a prioritized list of primary and alternative reference sources, such as those described above, every time a reference source is acquired that is considered more accurate than the source currently available to discipline the LO, then it may be possible to get more information regarding the current accuracy of the LO. As such when a reference source becomes available having improved accuracy, an offset error that may have accumulated during the duration of the holdover may be corrected.

However, in some situations when the primary master reference source becomes available after having been unavailable, the primary master reference source becomes unavailable again before the master primary reference source can be used to discipline the LO on an ongoing basis. The time and/or frequency signal recovered during the temporary availability of the primary master reference source can be used to improve the synchronization and/or syntonization of the LO, relative to the temporary availability of the primary master reference source, in an effort to reduce the offset error.

In a device without the ability to use the temporary availability of the primary reference to correct the offset error based on the limited availability of the primary master reference source as described herein, the LO may remain in the holdover state. For example, unless a primary master reference source is available for a predetermined period of time, such as a length of time in which the master primary reference source is used to discipline the LO on an ongoing basis, the device containing the LO does not correct the offset error based on the temporary availability of the master reference source. An extended holdover duration may be detrimental to the synchronization and/or syntonization of the device.

A result of correcting offset error based on a temporary availability of the primary master reference source is that an overall holdover duration, which is the duration over which no primary master reference source is available for a long enough duration to be used on an ongoing basis to discipline the LO, may be longer than if the temporary availability could not be used to correct the offset error. In such a case, a time and/or frequency signal from the primary master reference source that is temporarily available results in the time and/or frequency offset error of the LO being reduced. The LO should be more closely aligned relative to the primary master reference source than if the LO was left in a holdover state and not disciplined by information obtained during the temporary availability of the master reference source.

In some embodiments, the device may only receive a time and/or frequency signal from a single primary master reference source and when the primary master reference source is unavailable the device enters the holdover state in which an attempt is made to maintain the stability and syntonization of the LO.

In some embodiments, the device may receive time and/or frequency signals from more than one master reference source, which are ordered from most accurate to least accurate. When the primary reference source is unavailable, then the holdover state is entered during which time the alternate, less accurate, master reference sources may be used, at least in part, to discipline the LO.

If the primary master reference source becomes unavailable, once the offset error has been reduced by bringing the LO into synchronization and/or syntonization relative to the information obtained during the temporary availability of the primary master reference source, the device returns to the holdover state.

Some embodiments of the invention may be used in implementing a module for use in a network node to reduce cost associated with synchronization and/or syntonization of the network node. The network node may be for example a base station or relay in a telecommunication network or a network node in an enterprise network. Generally speaking, the module may be part of, or located in close proximity to, any type of network node in a network in which the network node can utilize a localized timing source such as a LO.

A finite state diagram pertaining to some embodiments of the invention will now be described with regard to FIG. 4. A first state is a state in which the time synchronisation or frequency syntonization of the LO may be compared against a master reference source. This may be a single master reference source, if only one reference source is used to discipline the LO, or a primary master reference source designated the most accurate source, if multiple master reference sources are available. This is indicated in FIG. 4 as "Locked To Master Reference Source State" 410.

A second state is a state in which, if the master reference source becomes unavailable for some reason, an attempt to maintain the synchronization and syntonization of the LO is made based on a model of the LO's behaviour over environmental parameters such as, but not limited to, temperature, time, and supply voltage. In some embodiments, the attempt to maintain the synchronization and syntonization of the LO is based on the use of alternate reference sources when the primary master reference source is unavailable and the alternate reference sources are available. This is indicated in FIG. 4 as "Holdover State" 420.

Figure 4:
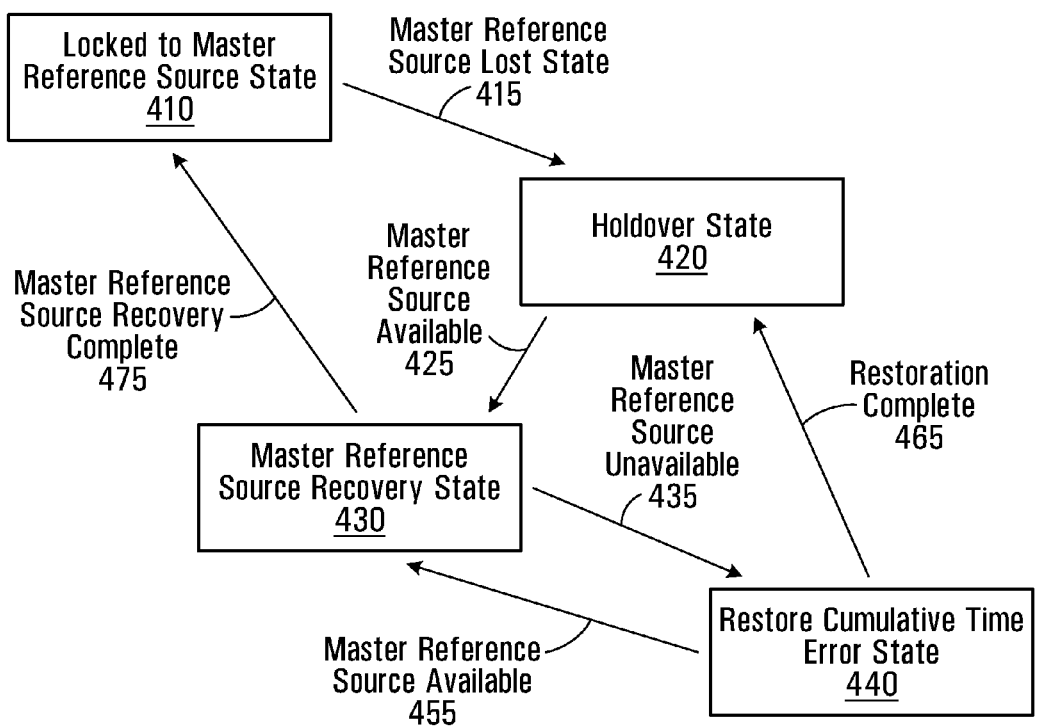
FIG. 4 is finite state diagram according to an embodiment of the invention.

The unavailability of the master reference source resulting in a move to "Holdover State" 420 is indicated in FIG. 4 as "Master Reference Source Lock Lost" 415.

A third state is a state in which, if the master reference source becomes available while in the "Holdover State" 420, an attempt is made to definitively update the synchronization and/or syntonization of the LO relative to the master reference source. This is indicated in FIG. 4 as the "Master Reference Source Recovery State" 430.

The occurrence of availability of the master reference source after having been unavailable resulting in a move to "Master Reference Source Recovery State" 430 is indicated as "Master Reference Source Available" 425.

A fourth state is a state in which, if the master reference source becomes unavailable during "Master Reference Source Recovery State" 430, the synchronization and/or syntonization information accumulated during the "Master Resource Recovery State" 430 is used to continue improving the synchronization and/or syntonization of the LO relative to the temporarily recovered master reference source. This is indicated as the "Restore Cumulative Time Error State" 440. A large time and/or frequency offset error may be accumulated during holdover depending on the duration of the holdover. Such an error can be reduced with a time and/or frequency signal recovered from the temporarily available master reference source, especially when compared to not correcting the error based on the temporary availability of the master reference source and allowing the error to become larger as the holdover duration increases.

The master reference source becoming unavailable again after having been temporarily available resulting in a move to "Restore Cumulative Time Error State" 440 is indicated as "Master Reference Source Unavailable" 435.

After the cumulative offset error has been corrected, or at least reduced based on the temporary availability of the master reference source in the "Restore Cumulative Time Error State" 440, control of the LO returns to the "Holdover State" 420. Returning to the "Holdover State" 420 from the "Restore Cumulative Time Error State 440" is indicated in FIG. 4 as "Restoration Complete" 465.

If the master reference source becomes available during the "Restore Cumulative Time Error State" 440, this results in a return to the "Master Reference Source Recovery State" 430. The master reference source becoming available again during the "Restore Cumulative Time Error State" 440 is indicated as "Master Reference Source Available" 455.

After the "Master Reference Source Recovery State" 430 has successfully recovered the master reference source and compensated any time and/or frequency offset error, control of the LO returns to the "Locked to Master Reference Source State" 410. In some embodiments, a phase error between the LO and the master reference source must be less than 200 nanoseconds before a return to the "Locked to Master Reference Source State" 410 is allowed. More generally, other implementation specific criteria may be established for enabling a return to the "Locked to Master Reference Source State" 410.

Returning to the "Locked to Master Reference Source State" 410 from the "Master Reference Source Recovery State" 430 is indicated as "Master Reference Source Recovery Complete" 475.

Some embodiments of the invention provide a finite state machine algorithm that tracks various states of operation of the module for the purpose of maintaining synchronization and/or syntonization of the LO relative to a master reference source.

Figure 5:
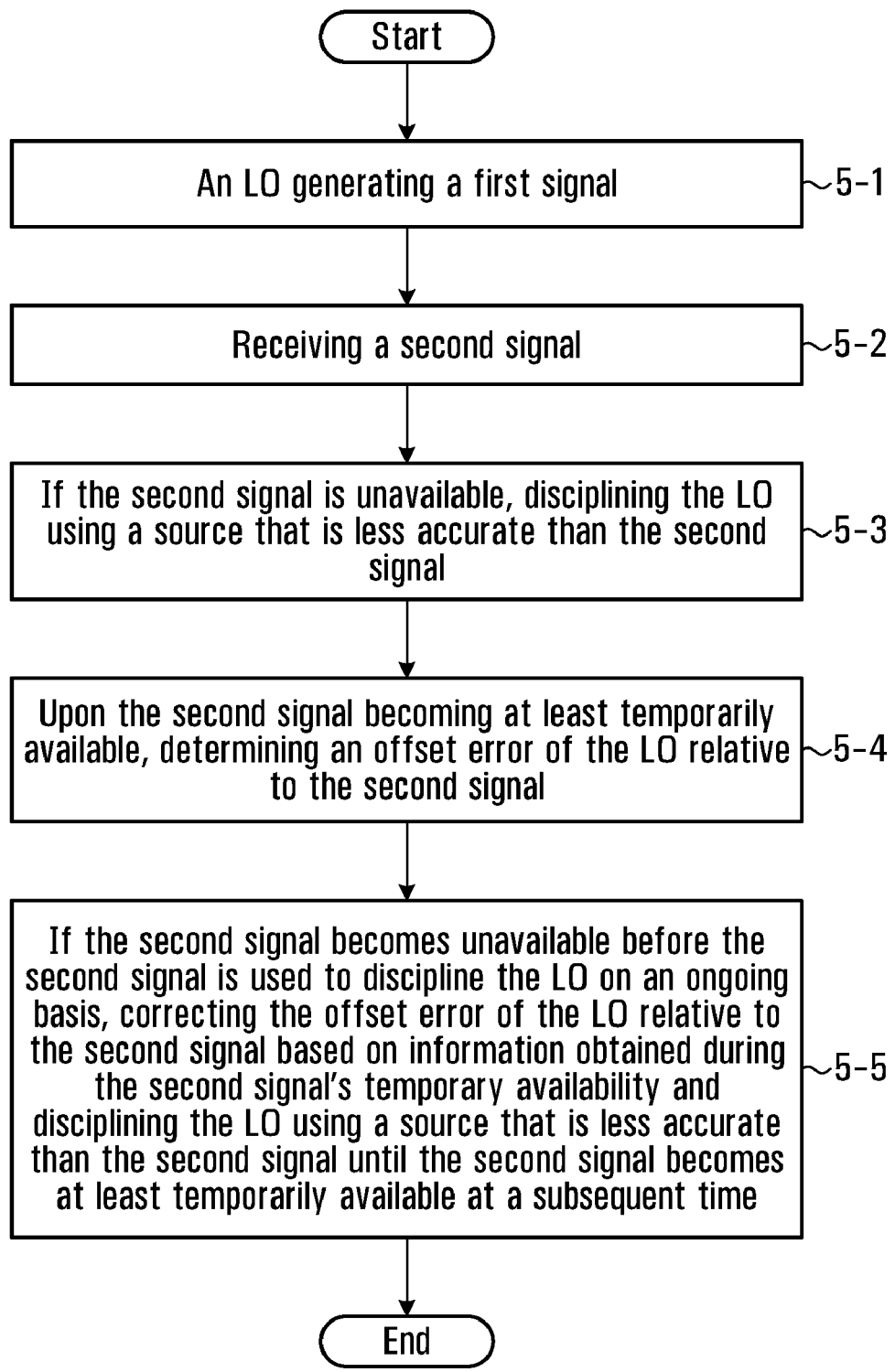
FIG. 5 is a flow chart illustrating another example of a method according to an aspect of the invention.

An example of a method pertaining to some embodiments of the invention will now be discussed with reference to the flow chart of FIG. 5. A first step 5-1 of the method involves a LO generating a first signal that includes one of time information; frequency information, phase information, or combinations thereof.

A second step 5-2 of the method involves receiving at least one second signal that includes one of time information; frequency information, phase information, or combinations thereof. In some embodiments, the at least one second signal that is more accurate and/or stable than the first signal. In some embodiments, the at least one second signal may be less accurate/less stable than the LO, for example if the conditions for accurately characterizing accuracy and stability of the source, as described above, can be met. The at least one second signal may include at least one of, but not limited to, a signal from a GPS source, a mathematical model of the LO, a signal from a network time reference source, and/or a signal from a network frequency reference source. In some embodiments the at least one second signal is received at the network node including the LO from an external source, such as in the case with the signal from the GPS source. In some embodiments, the at least one second signal may be generated or maintained on the network node, such as in the case of the model of the LO.

A third step 5-3 involves, if the second signal is unavailable to discipline the LO, disciplining the LO using a source that is less accurate than the second signal.

A fourth step 5-4 involves upon the second signal becoming at least temporarily available, determining an offset error of the LO relative to the second signal that has become at least temporarily available.

A fifth step 5-5 involves, if the second signal becomes unavailable before the device uses the second signal to discipline the LO on an ongoing basis, correcting the offset error of the LO relative to the second signal based on information obtained during the second signal's temporary availability and disciplining the LO using a source that is less accurate than the second signal until the second signal becomes at least temporarily available at a subsequent time.

In some embodiments the method may further comprise steps described above relating to other embodiments of the invention such as, if there are at least two second signals, wherein one of the at least two second signals is a primary second signal assigned to be the most accurate of the at least two second signals and the other second signals of the at least two second signals are signals that are less accurate than the primary second signal than can be used when the primary second signal is at least temporarily unavailable: determining an accuracy of each of at least two second signals in relation to the primary second signal; ordering the at least two second signals from most accurate to least accurate; and disciplining the LO to correct the offset error of the LO relative to the primary second signal that is available, based on the ordering of at least two second signals.

Figure 6:
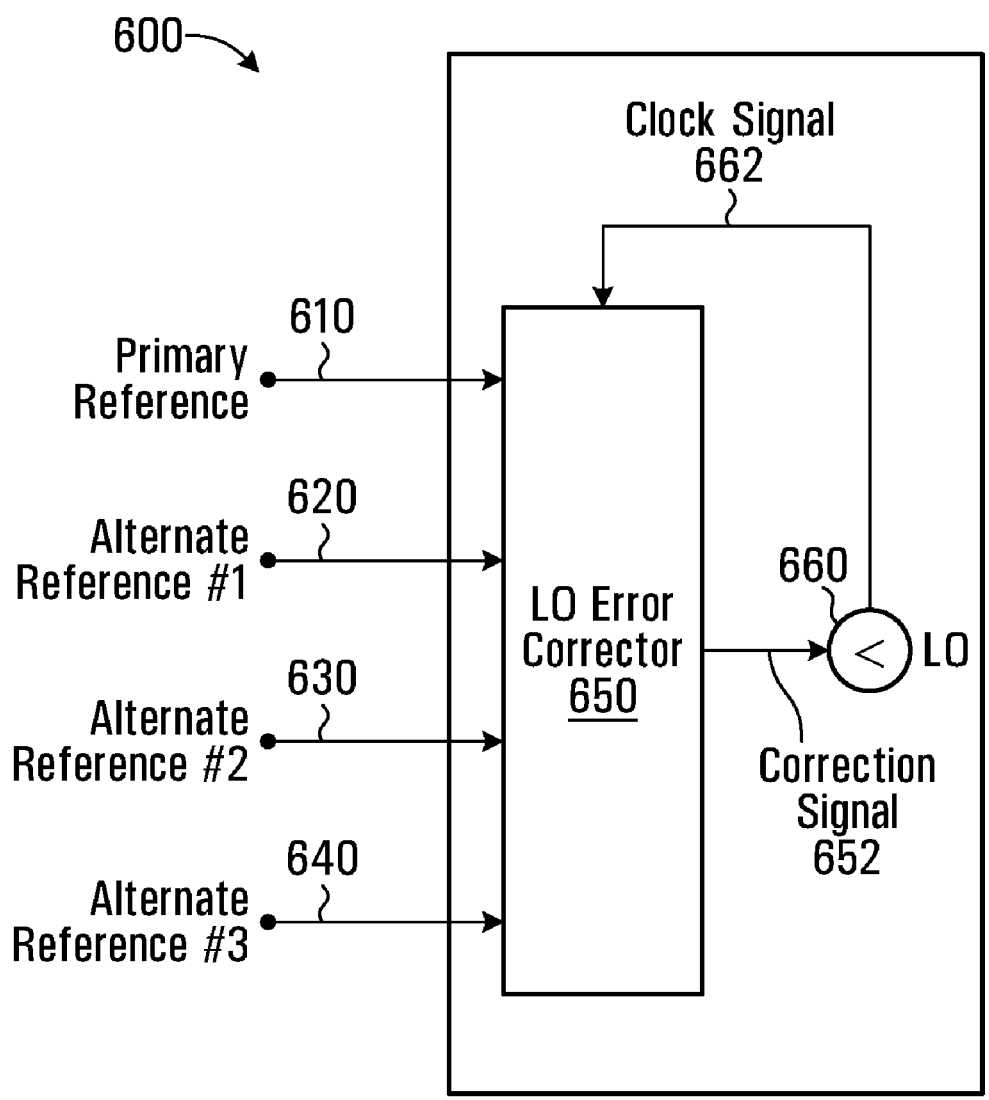
FIG. 6 is a schematic diagram of an example of a slave device according to another aspect of the invention.

A detailed example of a slave device will now be described with reference to FIG. 6. FIG. 6 illustrates a slave device 600 having multiple inputs 610,620,630,640 for receiving time and/or frequency signals from multiple master resource sources (not shown). The slave device also includes a LO error corrector 650 which receives the multiple inputs 610, 620,630,640. The LO error corrector 650 is configured to, if the second signal is unavailable to discipline the LO, discipline the LO using a source that is less accurate than the second signal.

The LO error corrector 650 is further configured to, if the second signal becomes unavailable before the device uses the second signal to discipline the LO on an ongoing basis, correct the offset error of the LO relative to the second signal based on information obtained during the second signal's temporary availability and discipline the LO using a source that is less accurate than the second signal until the second signal becomes at least temporarily available at a subsequent time.

An output 652 of the LO error corrector 650 is provided to an LO 660. An output 662 of LO 660 is also provided to an input of the LO error corrector 650 to aid in determining a correction signal from one or more of the inputs that is used to correct the offset error.

In some embodiments, the functionality of the LO error corrector 650 may be included in a prioritizer of the type, or a type similar to, prioritizer 250 of FIG. 3. In some embodiments, the LO error corrector may be a separate functional module that operates on a correction signal output from a prioritizer of the type, or a similar type to, prioritizer 250 of FIG. 3.

FIG. 6 illustrates that there are multiple inputs to the LO corrector. However, in some embodiments, the LO corrector has only a single input, which receives a single second signal used to discipline the LO. When the single second signal is unavailable, one manner of disciplining of the LO may be performed by locking the tuning position of the LO at a position having the most accurate and/or stable signal for as long as necessary until better information can be applied.

The LO error corrector 650 may be implemented in software, hardware, or some combination thereof. For example, in a software implementation the various signal comparison processes are implemented as one or more software modules and the ordering functionality is implemented by another module. In a hardware implementation, the various signal comparison processing and ordering functionality may be implemented using, for example, but not limited to, ASIC or FPGA.

Numerous modifications and variations of the present invention are possible in light of the above teachings. It is therefore to be understood that within the scope of the appended claims, the invention may be practised otherwise than as specifically described herein.

The invention claimed is:

1. A device comprising:
a local oscillator (LO) configured to generate a first signal comprising at least one of: timing information; frequency information; phase information; and combinations thereof;
a prioritizer comprising at least two inputs, each input configured to receive a respective second signal comprising at least one of: timing information; frequency information; phase information; and combinations thereof, the prioritizer configured to:
determine an accuracy of at least one second signal of the at least two second signals in relation to a second signal assigned to be a most accurate of the at least two second signals; and
order the at least two second signals from most accurate to least accurate;
wherein the LO is disciplined to correct an offset error of the LO relative to a most accurate second signal that is available to the device, based on the order of the at least two second signals.

2. The device of claim 1 wherein a second signal of the at least two second signals is selected to be the assigned most accurate second signal for the purpose of ordering the at least two second signals.

3. The device of claim 1, wherein if the assigned most accurate second signal is unavailable, the LO is disciplined relative to a next most accurate second signal that is available to the device, based on the ordering of the at least two second signals.

4. The device of claim 1, wherein each input of the at least two inputs is configured to receive a respective second signal that is one of a group of signals including:
a) a GPS timing signal;
b) a network timing signal;
c) a network frequency signal;
d) a signal resulting from a mathematical model of the LO; and e) a signal derived from a period during which the LO was disciplined by the assigned most accurate second signal; and
f) a signal comprising synchronization information.

5. The device of claim 4 wherein the network timing signal is in accordance with IEEE 1588.

6. The device of claim 4 wherein the network frequency signal is in accordance with at least one of: Synchronous Ethernet and adaptive clock recovery (ACR).

7. The device of claim 4 wherein the mathematical model of the LO is at least one of:
generated by the device; and
maintained by the device.

8. The device of claim 1, wherein each input of the at least two inputs is configured to receive a respective second signal via one of:
free space;
an electrical conduit; and
an optical conduit.

9. The device of claim 1, wherein the order of the at least two second signals from most accurate to least accurate changes over time depending on various factors that affect the second signals.

10. The device of claim 1 configured to perform at least one of:
a) receive information sent by at least one source external to the device, the information pertaining to availability of the at least one source to provide to one input of the at least two inputs a respective second signal; and
b) detect availability of at least one source external to the device that provides to one input of the at least two inputs a respective second signal.

11. The device of claim 1 wherein the prioritizer further comprises:
a plurality of correction signal generators, each correction signal generator associated with a respective input, each correction signal generator configured to receive a second signal;
each correction signal generator configured to receive a clock signal from the LO;
each correction signal generator configured to generate a correction signal that is a function of the received input and the clock signal from the LO;
a plurality of summers, one summer for each second signal except the second signal assigned to be the most accurate, each summer configured to receive a correction signal from the second signal assigned to be the most accurate and a correction signal from one of the other second signals;
a correction signal selector configured to receive outputs of the plurality of summers, wherein the correction signal selector is further configured to order the at least two second signals from most accurate to least accurate as a function of the outputs of the summers.

12. A method comprising:
a local oscillator (LO) generating a first signal comprising at least one of: timing; frequency; phase information; and combinations thereof;
receiving at least two second signals, each second signal comprising at least one of: timing information; frequency information; phase information; and combinations thereof, wherein at least one of the at least two second signals is received from an external source;
determining an accuracy of at least one second signal of the at least two second signals in relation to a second signal assigned to be the most accurate of the at least two second signals;

ordering the at least two second signals from most accurate to least accurate; and disciplining the LO to correct an offset error of the LO relative to a most accurate second signal that is available, based on the ordering of the at least two second signals.

13. The method of claim 12 further comprising:

selecting a second signal of the at least two second signals as the assigned most accurate second signal for the purpose of ordering the at least two second signals.

14. The method of claim 12, wherein when the assigned most accurate second signal is unavailable:

disciplining the LO to correct the offset error comprises disciplining the LO to correct the offset error relative to a next most accurate second signal that is available, based on the ordering of the at least two second signals.

15. The method of claim 12, wherein receiving each of the at least two second signals comprises for each of the at least two second signals, receiving a respective signal that is one of a group of signals comprising:

a) a GPS timing signal;
b) a network timing signal;
c) a network frequency signal
d) a signal resulting from a mathematical model of the LO; and
e) a signal derived from a period during which the LO was disciplined by the assigned most accurate second signal; and
f) a signal comprising synchronization information.

16. The method of claim 15 wherein receiving the network timing signal comprises receiving the network timing signal in accordance with IEEE 1588.

17. The method of claim 15 wherein receiving the network frequency signal comprises receiving the network frequency signal in accordance with at least one of: Synchronous Ethernet and adaptive clock recovery (ACR).

18. The method of claim 15 further comprising at least one of:

generating the mathematical model of the LO; and
maintaining the mathematical model of the LO.

19. The method of claim 12 further comprising at least one of:

a) receiving information sent by at least one external source, the information pertaining to availability of the at least one external source to provide a second signal of the at least two second signals; and
b) detecting availability of at least one external source that provides a second signal of the at least two second signals.

20. The method of claim 12, further comprising reordering the at least two second signals from most accurate to least accurate based on various factors that affect the second signals over time.

* * * * *